(12) United States Patent
Zhang (10) Patent No.: US 10,686,419 B2
(45) Date of Patent: Jun. 16, 2020

(54) TUNABLE GAIN EQUALIZER (71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 0 days.

(21) Appl. No.: 16/365,604

(22) Filed: Mar. 26, 2019

(65) Prior Publication Data
US 2020/0036353 A1  Jan. 30, 2020

(51) Int. Cl.
*H03G 3/30* (2006.01)
*H03F 3/19* (2006.01)

(52) U.S. Cl.
CPC .............. *H03G 3/3036* (2013.01); *H03F 3/19* (2013.01); *H03F 2200/451* (2013.01); *H03G 2201/307* (2013.01)

(58) Field of Classification Search
None
See application file for complete search history.

(56) References Cited

U.S. PATENT DOCUMENTS

| | | | | |
|---|---|---|---|---|
| 3,718,874 A * | 2/1973 | Cooper, Jr. | .......... | H03H 7/0161 333/204 |
| 5,363,069 A | 11/1994 | Sadhir et al. | | |
| 6,518,859 B1 * | 2/2003 | Spampinato | ............ | H03H 7/12 333/174 |
| 6,801,102 B2 * | 10/2004 | Shamsaifar | ......... | H01P 1/20363 333/174 |
| 9,419,578 B2 * | 8/2016 | Leipold | ................ | H03H 7/0115 |
| 9,748,916 B2 * | 8/2017 | Bojer | .................... | H04L 5/1461 |
| 10,483,938 B2 * | 11/2019 | Lin | ....................... | H03H 7/0153 |

* cited by examiner

*Primary Examiner* — Jeffery S Zweizig
(74) *Attorney, Agent, or Firm* — Michael North; North Weber & Baugh LLP (57) ABSTRACT

Various embodiments of the invention relate to a tunable gain equalizer to enable a RF output with constant gain over a wide frequency band. The tunable gain equalizer comprises a series path formed by a plurality of adjustable capacitors coupled in series, and two shunt paths coupled to the series path. The adjustable capacitors may be varactors coupled to a biasing voltage for capacitance adjustment. The shunt paths comprise inductors to enable a positive gain slope to compensate negative gain slope of RF amplifiers. The shunt paths may be bridged by one or more branches connected between the two shunt paths. The bridged branches provide a higher tunable gain slope amount and a better input/output matching. By making the biasing voltage of the tunable gain equalizer temperature dependent, the tunable gain equalizer is able to generate a temperature dependent gain slope to offset the temperature variation influence.

19 Claims, 6 Drawing Sheets

TUNABLE GAIN EQUALIZER

CROSS-REFERENCE TO RELATED APPLICATIONS

This application claims foreign priority to Chinese Patent Application No. 201810841286.4, entitled "TUNABLE GAIN EQUALIZER", naming Cemin Zhang as inventor, and filed Jul. 27, 2018, the subject matter of which is hereby incorporated herein by reference.

BACKGROUND

A. Technical Field

The present invention relates generally to a gain equalizer, and more particularly to a wideband tunable gain equalizer.

B. Background of the Invention

Many radio frequency (RF) systems, especially with wide operation band, require constant gain and power output across a wideband. A wideband amplifier usually has a gain falling off at higher frequency, i.e. a negative gain slope shape. Different components within a RF chain may have different negative gain slope shape. Furthermore, under different operation temperatures, an amplifier gain slope varies.

Equalizers have been used to address the issue of gain variations. Equalizers may be passive or active for achieving a desired attenuation slope. Given the negative gain slope variations between different RF components and under different temperatures, conventional equalizers with fixed gain slope are not able to address the above issues effectively.

Accordingly, there is a need for a tunable gain equalizer that has a wide operation bandwidth and may effectively address negative gain slopes variations.

SUMMARY OF THE INVENTION

The invention relates to a tunable gain equalizer that has a wide operation band and may effectively address negative gain slopes variations in broadband RF systems.

In one or more embodiments, this invention features a wideband tunable gain equalizer. The tunable gain equalizer comprises a series path comprising a first capacitor and a second capacitor coupled between an RF input terminal RF1 and an RF output terminal RF2. The tunable gain equalizer further comprises a first shunt path and a second shunt path coupled to the series path. Each shunt path comprises one or more segments coupled in series, with each segment comprising a resistor and an inductor in series connection. The first shunt path comprises a first segment and a second segment; the second shunt path comprises a third segment and a fourth segment. Each segment may comprise a resistor and an inductor coupled in series. The first shunt path and the second shunt path may be "bridged" by one or more branches connected between the two shunt paths at some intermediate point along them. The first capacitor and the second capacitor on the series path may function as a first branch to connect the two shunt paths at coupling points between the shunt paths and the series path; while a short-circuited branch may connect the two shunt paths at intermediate points between segments on each of the first shunt path and the second shunt path to provide a higher gain slope amount and a better input/output matching.

In one or more embodiments, the first capacitor and the second capacitor are adjustable capacitors, e.g. varactors coupled back-to-back in series. The cathodes of both varactors are connected together and coupled to a biasing voltage source VT via a biasing resistor Rbias, which provides DC-RF isolation between the VT and series path. The biasing voltage source VT may be adjusted to collectively control the capacitance of both varactors. In one or more embodiments, the varactors couples together back-to-back in series with a DC isolation capacitor in-between. Each of the varactors couples to a respective biasing voltage source such that the capacitance of the varactors may be adjusted individually or independently from each other.

In one or more embodiments, a tunable gain equalizer system incorporating gain compensation over different temperatures is disclosed. The tunable gain equalizer system addresses the issues of gain variations due to various temperatures by making the biasing voltage VT of the tunable gain equalizer temperature dependent to offset the temperature variation influence. The tunable gain equalizer system comprises a tunable gain equalizer, a temperature sensor, a microcontroller unit (MCU), a digital-to-analog converter (DAC), and an amplifier. The temperature sensor senses ambient temperature and outputs an output voltage representing ambient temperature. The MCU receives the output voltage and generates a digital control signal based on the output voltage. The digital control signal is converted into a temperature dependent biasing voltage VT by the DAC. The tunable gain equalizer receives an RF input signal and outputs an equalizer output signal. The equalizer output signal is then amplified by the amplifier to generate the RF output signal, which has a constant gain over a wide frequency band and temperature range.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Figure ("FIG.") 1 depicts a typical wideband amplifier gain under different frequencies and temperatures.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Figure 1:
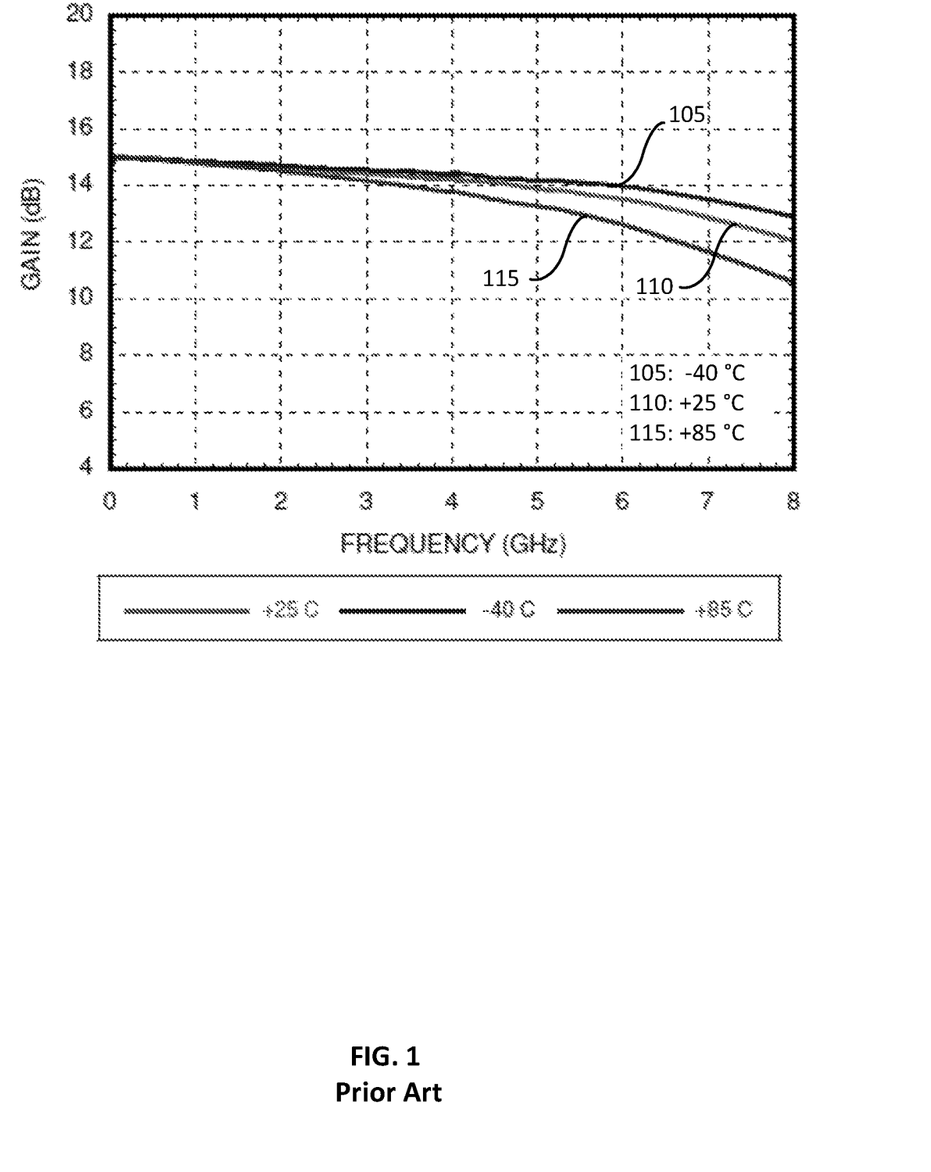

FIG. 1 depicts gains of a wideband amplifier HMC311SC70 from Analog Devices at different frequencies and temperatures. As shown in FIG. 1, the amplifier has negative gain slopes, with less gain under higher frequencies. Furthermore, the gain of the amplifier shows a temperature variation, especially at higher frequencies. For example, the gain 105 (corresponding to −40° C. temperature) is higher than the gain 110 (corresponding to +25° C. temperature) and the gain 115 (corresponding to +85° C. temperature). Such a gain variation under both frequency and temperature brings more challenge for gain compensation to achieve a constant gain and power output across a wideband. It is obvious that a gain equalizer with a fixed gain slope will not solve the aforementioned amplifier gain variation issue.

Figure 2:
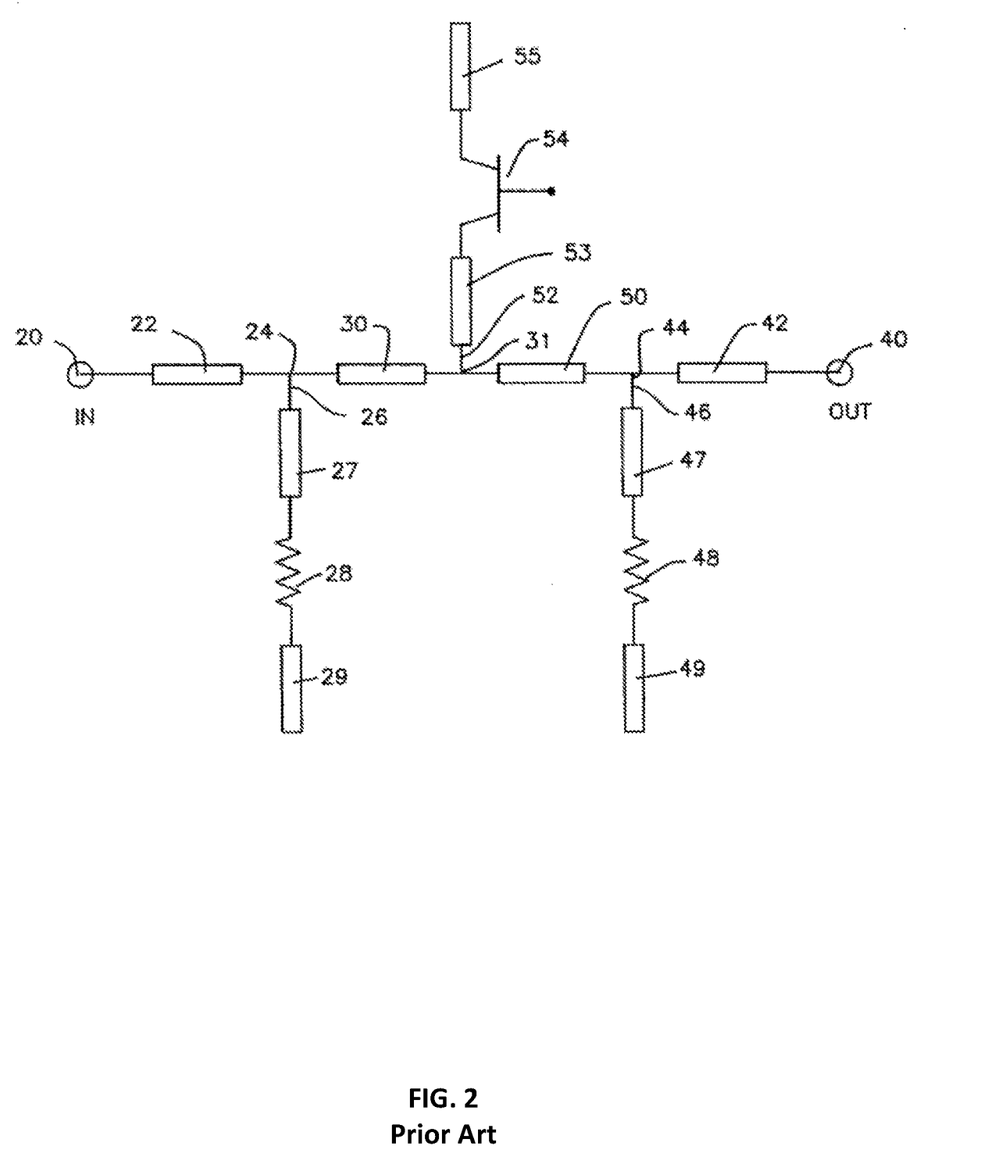
FIG. 2 graphically depicts a prior art hybrid equalizer circuit using a field effect transistor (FET) as a voltage variable resistor.

FIG. 2 depicts a prior art equalizer circuit using a field effect transistor (FET) as a voltage variable resistor. The equalizer, disclosed in U.S. Pat. No. 5,363,069, comprises a series of microstrip transmission lines between an RF input terminal 20 and an RF output terminal 40 and a shunt path comprised of a series combination of a FET 54 and a stub tuner 53 microstrip transmission line. The FET 54 is able to be switched between a conducting state and a non-conducting state. The FET is used as a voltage variable resistor to selectively de-Q the stub tuner and therefore to control the depth of the equalization curve. However, as disclosed in U.S. Pat. No. 5,363,069, the equalizer circuit has parabolic gain shapes where the gain is at a minimum at the center operating frequencies. The parabolic gain shapes may not be able to match well to compensate the negative gain slope of a wideband amplifier for a constant gain output. Furthermore, the range of impedances that can be matched via the stub tuner is determined by the spacing between the stubs, which is normally fixed and therefore limits the applicability for wideband applications.

Embodiment 1

Figure 3:
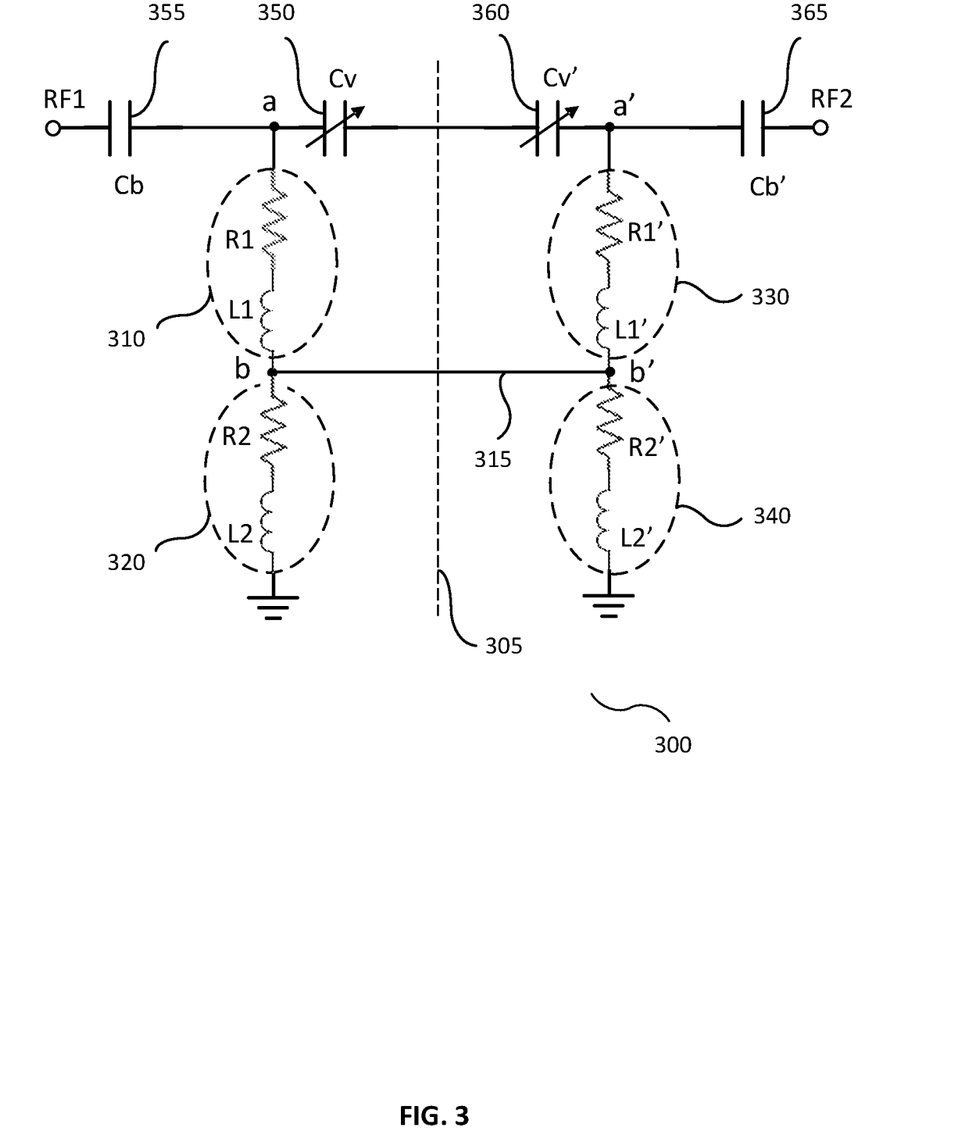
FIG. 3 depicts a schematic diagram of a tunable gain equalizer according to embodiment 1 of the invention.

FIG. 3 depicts a schematic diagram of a tunable gain equalizer 300 according to embodiment 1 of the invention. The tunable gain equalizer comprises a series path comprising a plurality of capacitors (e.g. a first capacitor 350 and a second capacitor 360) coupled between an RF input terminal RF1 and an RF output terminal RF2. The tunable gain equalizer further comprises a first shunt path and a second shunt path coupled to the series path. In one or more embodiments, each shunt path comprises one or more segments coupled in series, with each segment comprising a resistor and an inductor in series connection. As shown in the embodiment in FIG. 3, the first shunt path comprises a first segment 310 (resistor R1 and inductor L1) and a second segment 320 (resistor R2 and inductor L2); the second shunt path comprises a third segment 330 (resistor R1' and inductor L1') and a fourth segment 340 (resistor R2' and inductor L2'). The first shunt path and the second shunt path may be "bridged" by one or more branches connected between the two shunt paths at some intermediate point along them. For example, the first capacitor 350 and the second capacitor 360 on the series path may function as a first branch to connect the two shunt paths at points (a and a') of the shunt paths; while a short-circuited branch 315 may connect the two shunt paths at points (b and b') of the shunt paths. The short-circuited branch 315 may provide a higher tunable gain slope amount and a better input/output matching.

In one or more embodiments, the series path further comprises a first DC blocking capacitor Cb 355 (coupled between RF1 terminal and the first capacitor 350) and a second DC blocking capacitor Cb' 365 (coupled between RF2 terminal and the second capacitor 360). The two DC blocking capacitors function to block DC component from RF input and prevent DC component leaking into RF output.

In one or more embodiments, the tunable gain equalizer 300 has a symmetric topology along a virtue symmetric line 305. Such a configuration ensures that the equalizer 300 may have a scattering matrix with symmetrical S11/S22 parameters (the equalizer 300 is viewed as a 2-port network with RF1 terminal and RF2 terminal) for easy design and additional usage convenience, e.g. RF input signal may be fed to the equalizer 300 from either the RF1 terminal or the RF2 terminal. Correspondently, RF output signal may be output from the equalizer from either the RF2 terminal or the RF1 terminal.

By arrange the capacitors in the series path and at least one inductor in a shunt path, the tunable gain equalizer 300 enables a positive gain slope by principle. In one or more embodiments, at least one of the first capacitor 350 and the second capacitor 360 may be adjustable in capacitance such that the tunable gain equalizer 300 may have a tunable positive gain slope to match with various other RF components, e.g. amplifier, to enable a RF output with constant gain over a wide frequency band. The first capacitor 350 and the second capacitor 360 may be adjusted together, individually, or independently from each other. In one or more embodiments, the first capacitor 350 and the second capacitor 360 may be a switchable capacitor, a voltage tuned capacitor (e.g. a varactor), a digitally tuned capacitor, a fixed capacitor combined with an adjustable capacitor, etc.

One skilled in the art shall understand various modifications to the embodiments shown in FIG. 3 may be applicable for a desirable gain equalizer. For example, one or more segments in the first and second shunt paths may be configured to be adjustable with adjustable resistor or inductor. Furthermore, although all segments shown in FIG. 3 are similar in structure, one skilled in the art shall understand segment variations may be used for equalizer tuning. For example, the segments 310 and 330 may have inductor only, while segments 320 and 340 may have both resistor and inductor. Such variations shall still be within the scope of this invention.

Embodiment 2

Figure 4:
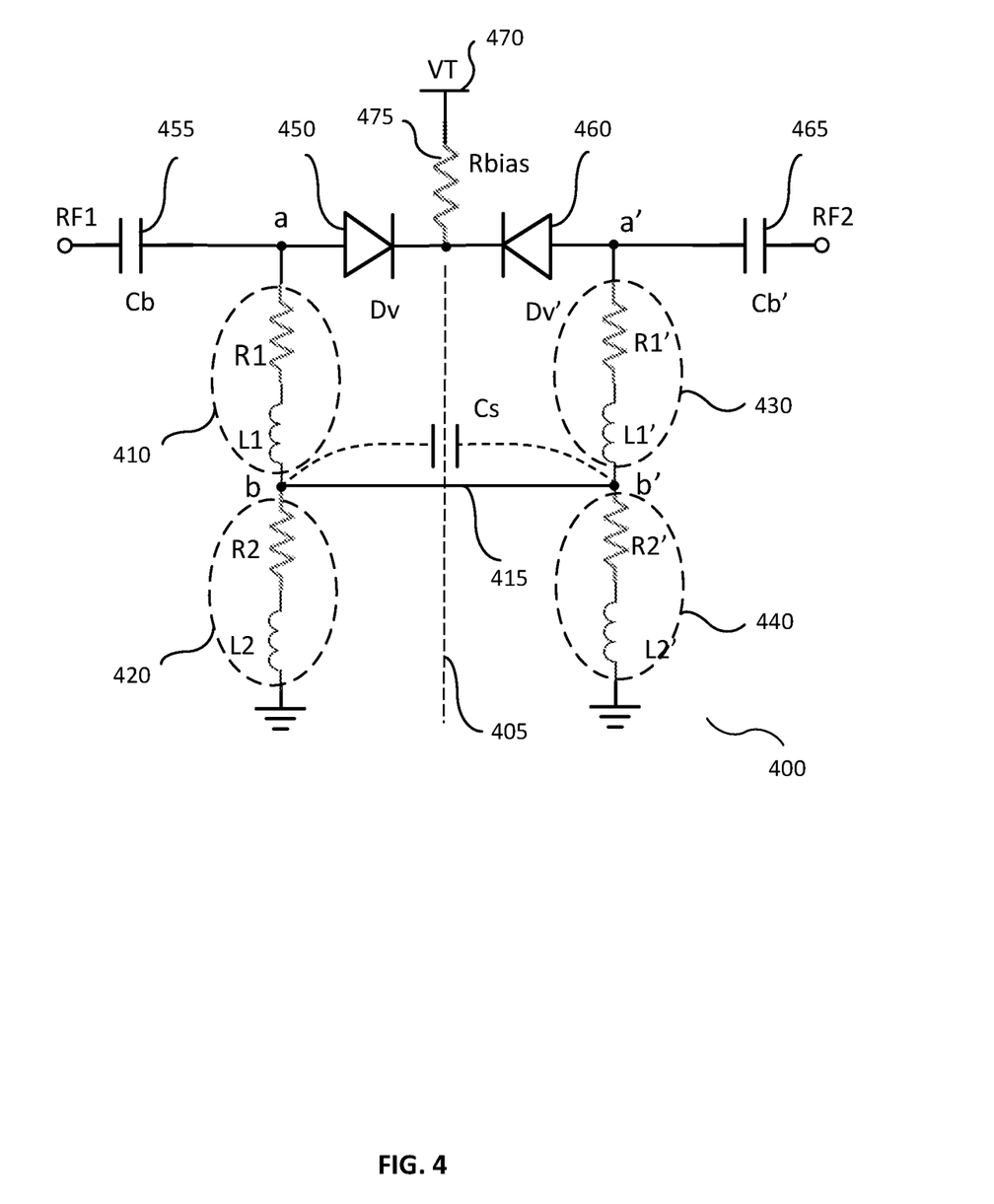
FIG. 4 depicts an alternative schematic diagram of a tunable gain equalizer according to embodiment 2 of the invention.

FIG. 4 depicts an alternative schematic diagram of a tunable gain equalizer according to embodiment 2 of the invention. The tunable gain equalizer 400 comprises a series path between an RF input terminal RF1 and an RF output terminal RF2, a first shunt path and a second shunt path coupled to the series path. The series path comprising a first varactor 450 and a second varactor 460 coupled back-to-back in series. The cathodes of both varactors are connected together and coupled to a biasing voltage source VT 470 via a biasing resistor Rbias 475, which provides DC-RF isolation between the VT 470 and series path. The biasing voltage source VT 470 may be adjusted to collectively control the capacitance of both the first varactor 450 and the second varactor 460. In one or more embodiments, an inductor may couple to the biasing resistor Rbias 475 in series to enhance the DC-RF isolation. In some embodiments, the series path further comprises a first DC blocking capacitor Cb 455 (coupled between RF1 terminal and the first varactor 450) and a second DC blocking capacitor Cb' 465 (coupled between RF2 terminal and the second varactor 460) for DC blocking between the gain equalizer 400 and external circuit.

In one or more embodiments, the first shunt path and the second shunt path have the same structure. Each shunt path comprises one or more segments coupled in series, with each segment comprising a resistor and an inductor in series connection. As shown in the embodiment in FIG. 4, the first shunt path comprises a first segment 410 (resistor R1 and inductor L1) and a second segment 420 (resistor R2 and inductor L2); the second shunt path comprises a third segment 430 (resistor R1' and inductor L1') and a fourth segment 440 (resistor R2' and inductor L2'). The first shunt path and the second shunt path may be "bridged" by one or more branches connected between the two shunt paths at some intermediate point along them. For example, the first varactor 450 and the second varactor 460 on the series path may function as a first branch to connect the two shunt paths at points (a and a') of the shunt paths; while a short-circuited branch 415 may connect the two shunt paths at points (b and b') of the shunt paths. The short-circuited branch 415 may provide a higher tunable gain slope amount and a better input/output matching. In one or more embodiments, the short-circuited branch 415 may be replaced by a capacitor Cs to provide a mean to adjust gain slope amount and gain slope shape of the tunable gain equalizer 400.

In one or more embodiments, similar to the tunable gain equalizer 300, the tunable gain equalizer 400 may also have a symmetric topology along a virtue symmetric line 405 such that RF input signal may be fed to the equalizer 400 from either the RF1 terminal or the RF2 terminal. Correspondently, RF output signal may be output from the equalizer 400 from either the RF2 terminal or the RF1 terminal.

In one or more embodiments, the first varactor 450 and the second varactor 460 couples together in series with a DC isolation capacitor (not shown in FIG. 4) in-between. The first varactor 450 and the second varactor 460 each couples to a respective biasing voltage source such that the capacitance of the first varactor 450 and the second varactor 460 may be adjusted individually or independently from each other.

Figure 5:
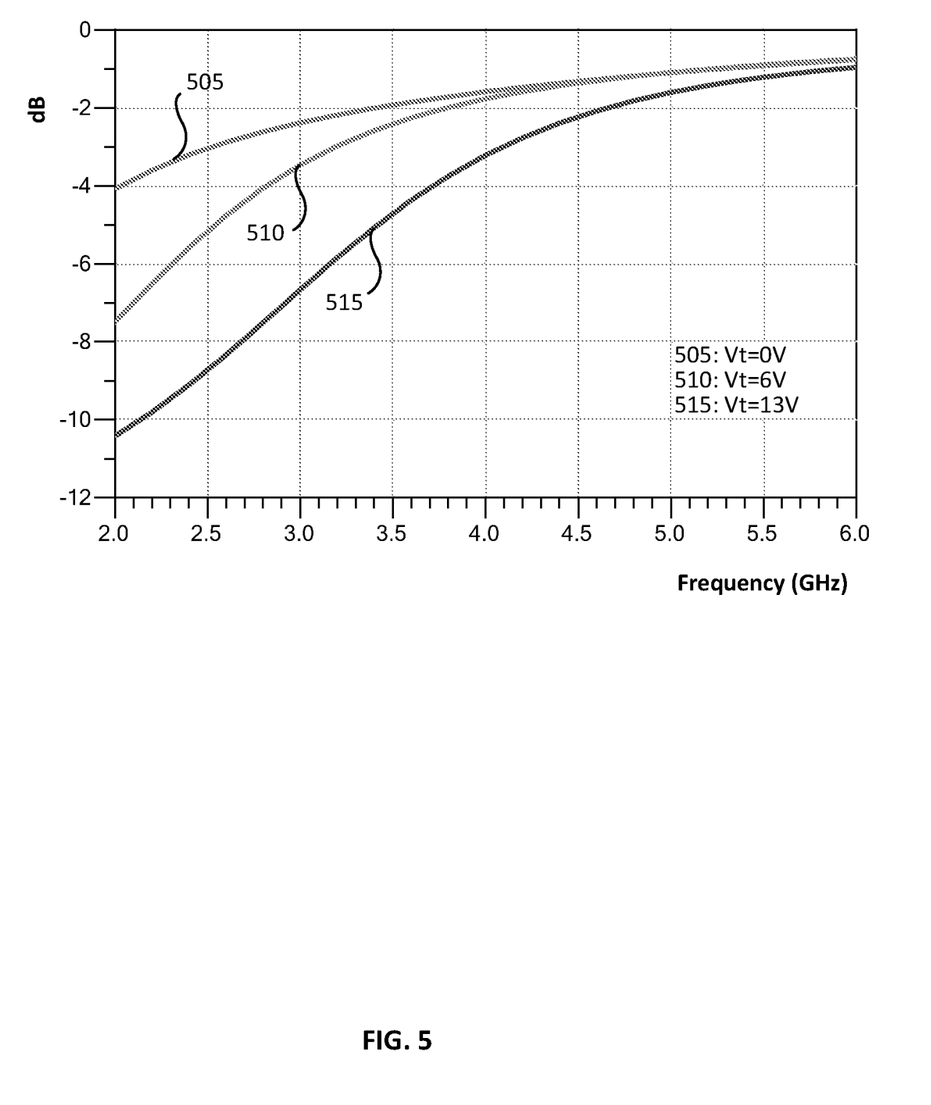
FIG. 5 depicts a diagram of insertion loss of a tunable gain equalizer according to embodiment 2 of the invention.

FIG. 5 depicts a diagram of insertion loss (or gain) of the tunable gain equalizer 400 according to one or more embodiment of the invention. As shown in FIG. 5, the tunable gain equalizer 400 shows positive gain slopes (505, 510 and 515) with an adjustable gain controlled by the biasing voltage. At higher biasing voltage, the tunable gain equalizer 400 has a larger positive gain slope.

Embodiment 3

Figure 6:
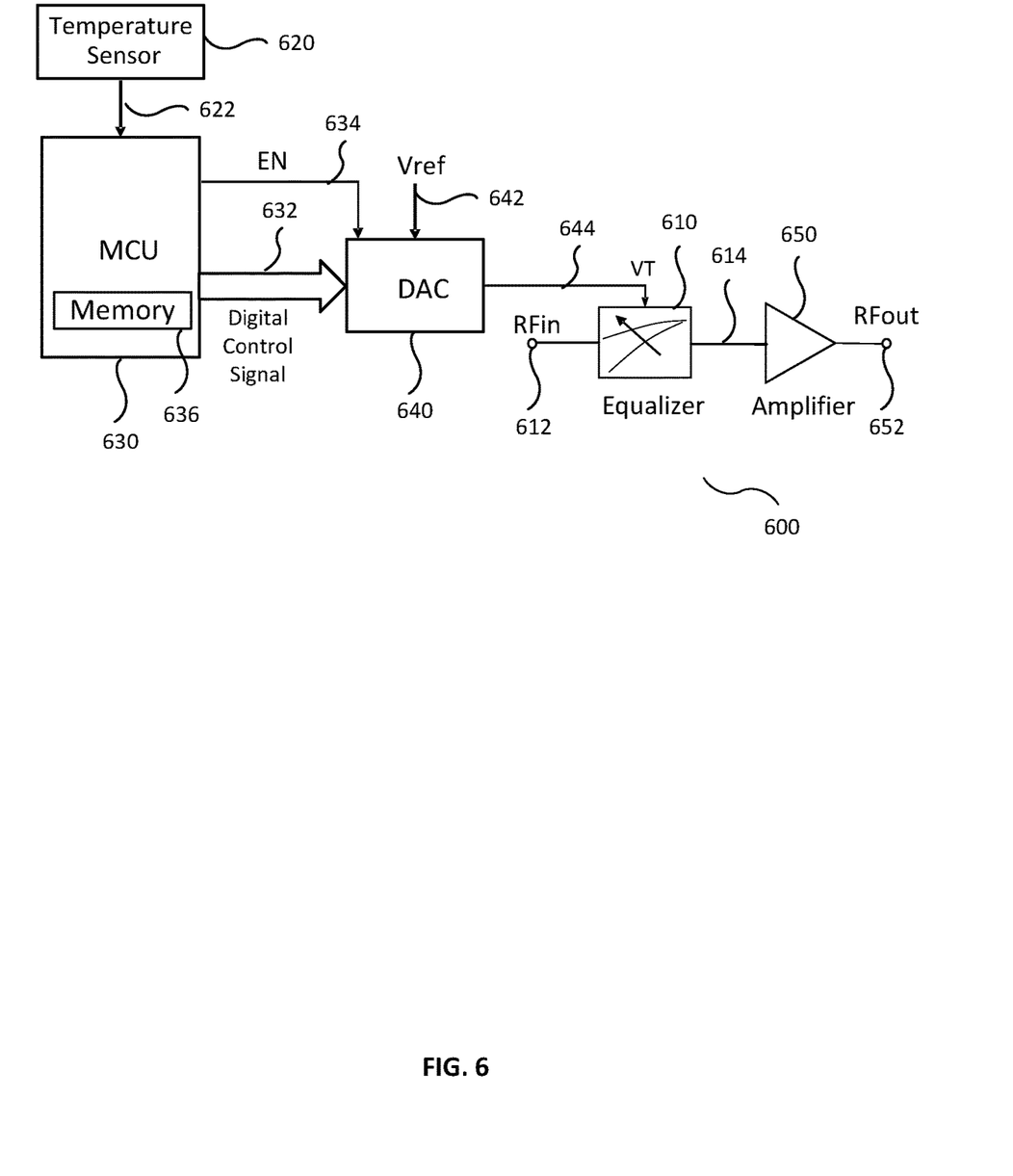
FIG. 6 depicts a block diagram of a tunable gain equalizer system incorporating gain compensation over different temperatures according to embodiment 3 of the invention.

FIG. 6 depicts a block diagram of a tunable gain equalizer system incorporating gain compensation over different temperatures according to embodiment 3 of the invention. One way to address the aforementioned gain variations due to various temperatures is making the biasing voltage VT of the tunable gain equalizer temperature dependent to offset the temperature variation influence. The tunable gain equalizer system 600 comprises a tunable gain equalizer 610, a temperature sensor 620, a microcontroller unit (MCU) 630, a digital-to-analog converter (DAC) 640, and an amplifier 650. The temperature sensor 620 senses ambient temperature and outputs an output voltage 622 representing ambient temperature. The MCU 630 receives the output voltage 622 and generates a digital control signal 632 based on the output voltage 622. The digital control signal 632 is converted into a temperature dependent biasing voltage VT 644 by the DAC 640. The tunable gain equalizer 610 receives an RF input signal RFin 612 and outputs an equalizer output signal 614, which is then amplified by the amplifier 650 to generate the RF output signal RFout 652, which has a constant gain over a wide frequency band and temperature range. The MCU 630 may also output an enable control signal (EN) 634 to enable/disable the DAC 640.

In some embodiments, the DAC 640 receives a reference voltage 642. The voltage level of the reference voltage determines the full scale DAC analog output, which corresponds to the maximum value of the biasing voltage VT 644. The digital control signal output signal 632 from the MCU is converted by the DAC into the biasing voltage VT 644 with voltage level fractional to the reference voltage 642. The fraction is determined by the numerical value of the digital control signal 632, which may comprise multiple binary bits, e.g. 8-bits comprising DB0-DB7.

In some embodiments, the MCU 630 incorporates a memory 636 storing a lookup table which relates a plurality of temperatures (e.g., from −40° C. to 85° C. with 2° C. resolution) with respective specific states of the digital control signal 632. The lookup table may be created during a test stage of the tunable gain equalizer system 600 and pre-loaded to the memory 636. The test stage may comprise tests performed at various control voltages under one or more frequencies and/or under one or more temperatures. When an output voltage 622 representing a temperature is received, the MCU 630 retrieves a corresponding state for the digital control signal from the lookup table and sends the digital control signal 632 with the retrieved corresponding state to DAC 640 to generate a desired biasing voltage 644, which is received by the tunable gain equalizer 610 to generate an equalizer output signal 614 with a desired gain or gain slope amount. In embodiments, the memory 636 may be an external memory but accessible by the MCU 630 for data retrieval.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:

1. A tunable gain equalizer comprising:
   a series path coupled between a first radio frequency (RF) terminal and a second RF terminal, the series path comprises at least one adjustable capacitor for gain tuning; and
   a first shunt path and a second shunt path coupled to the series path, each of the shunt paths comprising at least one inductor, the first shunt path and the second shunt path are at least bridged via a first branch comprising part of the series path and a second branch connecting respective intermediate points on the first and the second shunt paths, each of the first shunt path and the second shunt path comprises multiple segments coupled in series, each segment comprises a resistor and an inductor coupled in series.

2. The tunable gain equalizer of claim 1 wherein the at least one adjustable capacitor comprises a first adjustable capacitor and a second adjustable capacitor bridged between the first shunt path and the second shunt path.

3. The tunable gain equalizer of claim 2 wherein the first adjustable capacitor and the second adjustable capacitor are adjustable in capacitance collectively or independently.

4. The tunable gain equalizer of claim 1 wherein the second branch is a short-circuited branch or a capacitor.

5. The tunable gain equalizer of claim 1 wherein the tunable gain equalizer has a symmetric topology such that the tunable gain equalizer has a scattering matrix with symmetrical S11/S22 parameters.

6. The tunable gain equalizer of claim 2 wherein the first adjustable capacitor and the second adjustable capacitor are switchable capacitors, voltage-controlled capacitors, or a combination thereof.

7. The tunable gain equalizer of claim 1 wherein the intermediate points on the first and the second shunt paths for the second branch are intermediate points between the segments on each shunt path.

8. A tunable gain equalizer comprising:
   a series path coupled between a first radio frequency (RF) terminal and a second RF terminal, the series path comprises at least one adjustable capacitor to enable a positive gain slope for the tunable gain equalizer; and
   a first shunt path and a second shunt path coupled to the series path, at least one adjustable capacitor on the series path coupled between the first shunt path and the second shunt path, the at least one adjustable capacitor has adjustable capacitance to implement gain tuning for the tunable gain equalizer, each of the first shunt path and the second shunt path comprises multiple segments coupled in series, each segment comprises a resistor and an inductor coupled in series.

9. The tunable gain equalizer of claim 8 wherein the at least one adjustable capacitor comprises a first adjustable capacitor and a second adjustable capacitor coupled between the first shunt path and the second shunt path, the first adjustable capacitor and a second adjustable capacitor are varactors.

10. The tunable gain equalizer of claim 8 wherein each of the shunt paths comprising at least one inductor, the first shunt path and the second shunt path are bridged via a branch connecting respective intermediate points on the first and the second shunt paths.

11. The tunable gain equalizer of claim 9 wherein the varactors are coupled back-to-back in series with cathodes of both varactors jointed together and coupled to a common biasing voltage source for collective capacitance adjustment control.

12. The tunable gain equalizer of claim 9 wherein each of the varactors couples to a respective biasing voltage source such that the capacitance of each varactors is adjustable individually or independently from each other.

13. The tunable gain equalizer of claim 10 wherein the branch is a short-circuited branch or a capacitor.

14. A tunable gain equalizer system comprising: a temperature sensor generating an output voltage indicating ambient temperature; a microcontroller unit (MCU) generating a digital control signal based at least on the output voltage; a digital-to-analog converter (DAC) generating a temperature dependent biasing voltage based on the digital control signal and a reference voltage; and a tunable gain equalizer receiving a radio frequency (RF) input signal and the temperature dependent biasing voltage, the tunable gain equalizer comprises one or more voltage-controlled capacitors controlled by the temperature dependent biasing voltage for capacitance adjustment, the tunable gain equalizer generates an equalizer output signal with a desired gain or gain slope with reference to the RF input signal to offset temperature induced gain variations; and, the tunable gain equalizer comprising: a series path coupled between a first radio frequency (RF) terminal and a second RF terminal, the series path comprises at least one of the one or more voltage-controlled capacitors for gain tuning; and a first shunt path and a second shunt path coupled to the series path, each of the shunt paths comprising at least one inductor, the first shunt path and the second shunt path are at least bridged via a first branch comprising part of the series path and a second branch connecting respective intermediate points on the first and the second shunt paths, each of the first shunt path and the second shunt path comprises multiple segments coupled in series, each segment comprises a resistor and an inductor coupled in series; and an amplifier coupled to receive the equalizer output signal and generate an RF output signal with a constant gain.

15. The tunable gain equalizer system of claim 9 wherein the digital control signal has a state retrieved from a lookup table in correspondence to the ambient temperature indicated by the output voltage.

16. The tunable gain equalizer system of claim 9 wherein the reference voltage corresponds to a maximum value of the temperature dependent biasing voltage.

17. The tunable gain equalizer system of claim 15 wherein the lookup table is stored in a memory incorporated within the MCU or accessible by the MCU, the lookup table relates each one of a plurality of temperatures to a specific state of the digital control signal.

18. The tunable gain equalizer system of claim 15 wherein the lookup table is created during a test stage of the tunable gain equalizer system.

19. The tunable gain equalizer system of claim 18 wherein the test stage comprises tests performed at various temperature dependent biasing voltages under one or more temperatures.

* * * * *